United States Patent [19]

Sarraf et al.

[11] Patent Number: 5,558,720
[45] Date of Patent: Sep. 24, 1996

[54] RAPID RESPONSE VAPOR SOURCE

[75] Inventors: David B. Sarraf, Elizabethtown; David L. Miller, State College, both of Pa.

[73] Assignees: Thermacore, Inc., Lancaster; Pennsylvania State Research Foundation, University Park, both of Pa.

[21] Appl. No.: 584,288

[22] Filed: Jan. 11, 1996

[51] Int. Cl.[6] .................................................. C23C 14/00
[52] U.S. Cl. ............................................................. 118/726
[58] Field of Search ............................................. 118/726

[56] References Cited

U.S. PATENT DOCUMENTS

| | | | |
|---|---|---|---|
| 3,572,672 | 3/1971 | Harel | 427/250 |
| 4,125,086 | 11/1978 | Vig | 427/250 |
| 4,412,508 | 11/1983 | Ney | 427/250 |
| 4,698,235 | 10/1987 | Anderson | 427/250 |
| 4,700,660 | 10/1987 | Levchenko | 427/250 |
| 4,761,300 | 8/1988 | Schacter | 427/250 |
| 4,876,114 | 10/1989 | Phinney | 427/250 |

*Primary Examiner*—Richard Bueker
*Attorney, Agent, or Firm*—Martin Fruitman

[57] ABSTRACT

The apparatus is a rapid response evaporator for material deposition in vapor. The structure is a vessel which is heated to a temperature just above the melting temperature of the liquid which it contains. Inserted into the heated liquid is a funnel shaped evaporator structure in which the vertical tube is a capillary structure to raise the heated liquid from the vessel. The upper diverging portion of the evaporator contains a porous capillary interior coating in contact with the capillary tube, and the exterior is independently heated. Because of the low thermal mass of the upper portion of the evaporator and the liquid in its capillary structure, it can respond to heat changes quickly enough to rapidly vary the rate of evaporation and the thickness of the deposited coating.

8 Claims, 1 Drawing Sheet

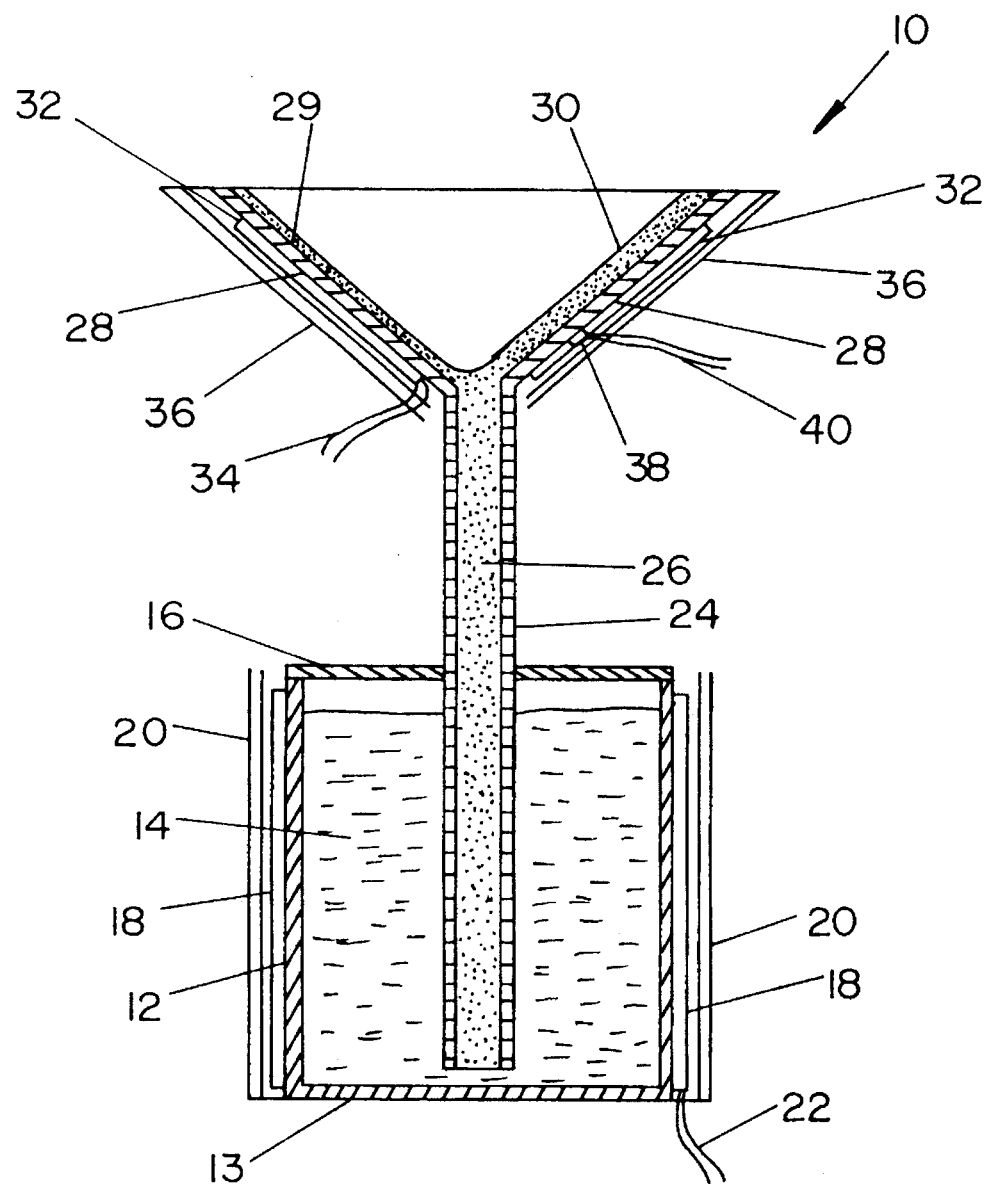

RAPID RESPONSE VAPOR SOURCE

BACKGROUND OF THE INVENTION

This invention deals generally with vapor coating and more specifically with an apparatus for producing vapor and varying the quantity of vapor produced.

Molecular beam epitaxy is a sophisticated ultra high vacuum evaporation process used to create thin epitaxial layers of materials. Much of the use of molecular beam epitaxy is in the growth of semiconductors such as GaAs and AlGaAs. Molecular beam epitaxy is favored for the growth of highly complex, multilayer structures where control over layer thickness and composition is essential. Typically, layer thickness must be controlled to 3% or better and composition must be controlled to within about 5%. Structures having more that 100 individual layers, such as vertical cavity surface emitting lasers, are now routinely grown in many research laboratories.

The success of the molecular beam epitaxy process rests heavily on the ability to precisely control the delivery of extremely high purity vapors of the constituent elements. This is now done in elemental source molecular beam epitaxy by the use of mechanical shutters to abruptly block and unblock the beams of condensible vapors, and through variation of constituent element vapor pressures by means of the variation and control of temperature. The source of these vapors is usually a crucible which contains the material to be evaporated and which is heated by a tubular furnace. Under ultra high vacuum conditions and at temperatures involved with the typical elements used, heat transfer between the heater, crucible, and temperature sensing element, which is usually a thermocouple, is essentially only by radiation. To provide accurate control of the material evaporating, the so-called "flux", careful design is required to keep the spatial relationship of the temperature sensor and the crucible constant, and thereby keep a constant relationship between crucible charge surface temperature and temperature at the temperature sensor. Despite this difficulty, conventional sources maintain flux within a few percent over time periods sufficient for epitaxial growth of the vast majority of structures. Longer term flux stability is not as good, and is limited by source material depletion and mechanical changes in the source operating conditions.

Although conventional sources work well when the rate of material deposition is relatively constant over time, the design of variable rate sources is a problem. Because of the need to load the crucible with sufficient material to allow for the growth of many microns of epitaxial semiconductor, molecular beam epitaxy sources typically contain many grams of gallium, aluminum, or indium. Moreover, to reduce the thermal load to the vacuum system, a large amount of thermal shielding is usually provided, and to provide the mechanical rigidity to maintain the source charge and the temperature sensor in a fixed geometry, structural bulk is also needed. The result is a vapor source with a significant thermal mass and a reduced radiative capacity. This means that its thermal response to changes of heat input is relatively slow.

Some molecular beam epitaxy processes require that the deposition rate of the vapor source be variable over an order of magnitude or more in a time span of a few seconds or less. This is achievable only with considerable difficulty using conventional vapor source designs. The thermal mass of the source makes adjustment of the vapor source's temperature at the speed required difficult or impossible. Furthermore, the reproducibility of the resulting temperatures is poor even for those temperature changes which are possible. For example, grading the emitter-base junction of a heterojunction bipolar transistor could be done in its simplest form with an aluminum flux change of about a factor of 15 over a thickness of 100–200 Angstroms, which at typical molecular beam epitaxy rates translates to 30–60 seconds. Even the most modern, high uniformity sources are not capable of controlled temperature changes at this rate.

SUMMARY OF THE INVENTION

The rapidly variable molecular beam epitaxy source of the invention can eliminate the drawbacks of existing designs. The design of the preferred embodiment is particularly well suited for the evaporation of gallium or indium. It comprises an evaporator structure with substantial surface coupled to a large liquid reservoir by a small capillary tube.

In the preferred embodiment the capillary is a tube of small diameter which contains sintered tungsten powder acting as a capillary wick. The evaporator surface, which is funnel shaped, is also covered with a wick which is a thin layer of sintered tungsten powder which is in contact with the capillary wick in the tube. A temperature sensor is attached to the evaporator structure, and both the liquid reservoir and the back surface of the evaporator structure are heated by radiant resistance heaters.

In the preferred embodiment, the reservoir is heated to a temperature just sufficient to melt the material being used and to initiate and sustain capillary action in the tube. The capillary tube draws the liquid material out of the reservoir and pumps it to the shaped evaporator surface. The sintered powder layer on the interior surface of the evaporator then spreads the liquid uniformly over the entire inner surface of the evaporator. The evaporator heater maintains the surface of the evaporator at a temperature sufficient to evaporate the coating material from the evaporator wick. This temperature of the evaporator is the same temperature at which a conventional source of the same material would operate if the surface area is also the surface area of the material to be evaporated in the conventional source. The temperature sensor attached to the evaporator structure accurately senses the temperature of the evaporator. Rate control of evaporation is achieved through variation of only the evaporator temperature, while the reservoir temperature remains constant.

The invention provides fast response through low thermal inertia because the thermal mass of the actual evaporator structure is minimal. The resulting thermal inertia of the evaporator structure is about two orders of magnitude less than conventional ovens, while supplying an equal amount of vapor flux for at least as long a time. The evaporator heater of the invention, designed to be attached to and radiate directly onto the backside of the evaporator, provides extremely rapid temperature changes. Cooling is accomplished by radiation, primarily from the vapor side of the evaporator, and because of the low thermal mass of the evaporator and heater assembly, reductions in temperature are also very rapid.

In addition to the speed of temperature adjustment, the invention has two other advantages over the prior art designs. Direct contact of the temperature sensor with the evaporating surface is an essential and important advance, since it eliminates time lag between flux changes and temperature sensing. This allows excellent feedback control of the vapor flux through control of temperature, even with rapid rates of temperature change.

Capillary feeding of the evaporator is another important advance. That provides a constant rate of delivery of material to the evaporator regardless of the distance of the material liquid surface from the top of the reservoir, so that day-to-day stability of the flux from the invention is much more stable than prior art designs. This reduces the need for frequent recalibration of the vapor source of the invention as is required with previously available vapor sources.

The present invention thereby furnishes a more stable vapor source which responds more quickly to changes in the required vapor flux and is easier to predictably control.

BRIEF DESCRIPTION OF THE DRAWING

The FIGURE is a simplified cross section drawing of the vapor source of the preferred embodiment of the invention.

DETAILED DESCRIPTION OF THE INVENTION

Structure of the Preferred Embodiment

The FIGURE is a simplified cross section drawing of vapor source 10 of the preferred embodiment of the invention in which reservoir 12 contains liquid 14. Reservoir 12 is covered by cover 16, heated by reservoir heaters 18, and surrounded by reservoir heat shield 20 so that its temperature can be accurately maintained. Reservoir heaters 18 are conventional electrical heaters fed by wires 22 from an electrical source (not shown).

Capillary tube 24 penetrates reservoir cover 16, is immersed in liquid 14 to a depth adjacent to bottom 13 of reservoir 12, and is contains sintered powder 26 which is continuous for the length of capillary tube 24 and acts as a capillary wick to lift liquid 14 from reservoir 12 up to evaporator 28. Evaporator 28, which in the preferred embodiment is shaped as a cone, is coated on its interior surface 29 with a sintered powder wick 30 which is in contact with one portion of sintered powder capillary wick 26 within capillary tube 24.

Evaporator heaters 32 are attached to evaporator 28 on the surface of evaporator 28 opposite from wick 30, which in the preferred embodiment is the underside of conical evaporator 28. Evaporator heaters 32 are conventional electrical heaters fed by wires 34 from an electrical source (not shown). Evaporator heat shields 36 are located to surround evaporator 28 and evaporator heaters 32, so that the heat from evaporator heaters 32 is concentrated upon evaporator 28.

Thermal sensor 38 is also attached to evaporator 28 on a surface other than that to which wick 30 is attached, and thermal sensor is interconnected with the evaporator controls (not shown) by wires 40.

In the preferred embodiment liquid 14 is gallium heated to above its melting point of about 25 degrees centigrade, and capillary tube 24 is a tungsten tube containing sintered tungsten powder 26. The diameter of capillary tube 24 is approximately 3 millimeters.

Evaporator 28 is also constructed of tungsten metal and evaporator wick 30 is also sintered tungsten powder. Evaporator 28 is heated to a temperature of approximately 950 degrees centigrade. The outer diameter of evaporator 28 is approximately 2 centimeters, and the thickness of the tungsten used is 0.75 millimeters.

Operation of the Preferred Embodiment

The operation of the invention is quite straightforward. Vapor source 10 is installed within a high vacuum environment, and reservoir heaters 18 are operated at a power which at least melts the material being used. Although gallium with a melting point of 25 degree centigrade is used in the preferred embodiment, many other materials, including aluminum and indium, are used in processes which require such vapor sources. In that context, it should be apparent that if a material is used which is a liquid at the temperature of the surrounding environment, no reservoir heater is needed.

Liquid 14 from reservoir 12 is moved by sintered powder capillary wick 26 within capillary tube 24 up to wick 30 on evaporator 28, and evaporator wick 30 distributes liquid 14 as a thin film evenly around evaporator 28 from which it is vaporized.

Evaporator heaters 32 are used to control the vapor being generated. Since the thermal mass of evaporator 28 is quite low, the temperature of evaporator 28 and the resulting quantity of vapor generated is directly and immediately affected by the heat supplied by evaporator heaters 32. Moreover, since temperature sensor 38 is in direct contact with evaporator 28, temperature sensor 38 always indicates the instantaneous temperature of evaporator 28 without any time lag after changes of heat input.

As previously discussed, the thermal mass of evaporator 28 is much lower than that of prior art devices, largely because evaporator 28 is separated from the main body of material to be evaporated, and because only a small structure and a small quantity of liquid need to be heated to the high vaporization temperature. This low thermal mass therefore permits very rapid response of the evaporator temperature to changes of heat input, and thus yields virtually instantaneous control of the quantity of vapor generated.

Therefore, unlike prior art devices which required mechanical shutters to block vapor from the surface onto which it was being deposited, with the present invention, a simple reduction of electrical power to the evaporator heater rapidly reduces the material being vaporized onto the target surface. Similarly, an increase in electrical power to the evaporator heaters increases the quantity vaporized.

In operation, the present invention can reduce the temperature of the evaporator 20 degrees centigrade per second, and it can achieve a change of vapor flux of two orders of magnitude in less than 10 seconds.

It is to be understood that the form of this invention as shown is merely a preferred embodiment. Various changes may be made in the function and arrangement of parts; equivalent means may be substituted for those illustrated and described; and certain features may be used independently from others without departing from the spirit and scope of the invention as defined in the following claims.

For example, evaporators may be constructed in shapes other than conical in order to shape the flux from the evaporator for better uniformity or for better utilization on the target surface. Furthermore, different materials may be used for the evaporator, the capillary tube, or the sintered material within the capillary tube and on the evaporator wick. Also, of course, other materials may be used for vapor generation.

What is claimed as new and for which Letters patent of the United States are desired to be secured is:

1. An apparatus for controlled generation of vapors comprising:

an evaporator structure with a first and a second surface;

an evaporator wick attached to and covering the first surface of the evaporator structure;

at least one evaporator heater attached to the second surface of the evaporator structure and means to operate each evaporator heater;

a capillary tube with a first end of the tube attached to the evaporator structure and a second end remote from the evaporator structure;

a capillary wick located within the capillary tube so as to furnish a continuous capillary path from the second end to the first end of the capillary tube and also located so that a portion of the capillary wick is in contact with the evaporator wick;

a container with liquid in the container; and the second end of the capillary tube located so that it is immersed in the liquid within the container.

2. The apparatus of claim 1 further including at least one reservoir heater attached to the container and operating means for the reservoir heater to melt a solid material within the container into a liquid.

3. The apparatus of claim 1 further including a temperature sensing device attached to the evaporator structure to furnish temperature information for control of the apparatus.

4. The apparatus of claim 1 further including heat shielding adjacent to the evaporator structure.

5. The apparatus of claim 1 further including heat shielding adjacent to the container.

6. The apparatus of claim 1 wherein the evaporator structure is shaped as a cone.

7. The apparatus of claim 1 wherein the liquid in the container is selected from the group of gallium, aluminum, and indium.

8. The apparatus of claim 1 further including a cover on the container, with the capillary tube penetrating the cover.

* * * * *